United States Patent
Schie et al.

(10) Patent No.: US 12,001,945 B2
(45) Date of Patent: Jun. 4, 2024

(54) EVENT DRIVEN MATHEMATICAL ENGINE AND METHOD

(71) Applicants: David Schie, San Jose, CA (US); Sergey Gaitukevich, San Jose, CA (US); Peter Drabos, San Jose, CA (US); Andreas Sibrai, San Jose, CA (US)

(72) Inventors: David Schie, San Jose, CA (US); Sergey Gaitukevich, San Jose, CA (US); Peter Drabos, San Jose, CA (US); Andreas Sibrai, San Jose, CA (US)

(73) Assignee: AIStorm Inc., Houston, TX (US)

( * ) Notice: Subject to any disclaimer, the term of this patent is extended or adjusted under 35 U.S.C. 154(b) by 1398 days.

(21) Appl. No.: 16/396,570

(22) Filed: Apr. 26, 2019

(65) Prior Publication Data
US 2019/0332929 A1    Oct. 31, 2019

Related U.S. Application Data

(60) Provisional application No. 62/663,121, filed on Apr. 26, 2018.

(51) Int. Cl.
| | |
|---|---|
| G06N 3/06 | (2006.01) |
| G06N 3/048 | (2023.01) |
| G06N 3/049 | (2023.01) |
| G06N 3/065 | (2023.01) |
| H01L 27/146 | (2006.01) |

(52) U.S. Cl.
CPC ............. *G06N 3/065* (2023.01); *G06N 3/048* (2023.01); *G06N 3/049* (2013.01); *H01L 27/14612* (2013.01)

(58) Field of Classification Search
CPC .... G06N 3/0635; G06N 3/0481; G06N 3/049; H01L 27/14612
See application file for complete search history.

(56) References Cited

U.S. PATENT DOCUMENTS

| | | | | |
|---|---|---|---|---|
| 4,206,446 A | * | 6/1980 | Rockett, Jr. ........... | H03M 1/804 257/241 |
| 5,504,839 A | * | 4/1996 | Mobus ..................... | G06N 3/04 706/41 |
| 5,666,468 A | | 9/1997 | Engel et al. | |
| 5,693,946 A | * | 12/1997 | Vickers ................. | G01T 1/2928 250/370.08 |

(Continued)

FOREIGN PATENT DOCUMENTS

EP        2911112 A1    8/2015

*Primary Examiner* — Omar F Fernandez Rivas
*Assistant Examiner* — Tri T Nguyen
(74) *Attorney, Agent, or Firm* — Weiss & Moy, PC; Jeffrey D. Moy

(57) ABSTRACT

An event driven device has a network collecting data. A device is coupled to the network for determining changes in the data collected, wherein the device signals the network to process the data collected when the device determines desired changes in the data collected. In a second embodiment a level shift adjusts the band diagram of a spill and fill circuit to allow processing only if a change in input value occurs. This is extended to teach a means by which the subset of an image or incoming audio data might be used to trigger an event. It could also be used for always on operation at lower power than alternative solutions.

7 Claims, 18 Drawing Sheets

(56) References Cited

U.S. PATENT DOCUMENTS

| | | | | |
|---|---|---|---|---|
| 5,742,741 A | * | 4/1998 | Chiueh | G06N 3/063 |
| | | | | 706/41 |
| 5,937,027 A | * | 8/1999 | Thevenin | G01T 1/2928 |
| | | | | 348/E3.019 |
| 6,014,653 A | | 1/2000 | Thaler | |
| 6,292,268 B1 | * | 9/2001 | Hirota | H04N 1/4052 |
| | | | | 382/237 |
| 6,317,154 B2 | * | 11/2001 | Beiley | H04N 25/575 |
| | | | | 348/E3.018 |
| 8,471,315 B1 | * | 6/2013 | Hynecek | H01L 31/103 |
| | | | | 257/292 |
| 9,213,781 B1 | | 12/2015 | Winter | |
| 10,587,830 B2 | * | 3/2020 | Mayer | H04N 25/771 |
| 2008/0136945 A1 | * | 6/2008 | Blanquart | H01L 27/14643 |
| | | | | 348/E5.081 |
| 2008/0174360 A1 | * | 7/2008 | Hsu | H02M 3/073 |
| | | | | 327/536 |
| 2013/0155302 A1 | * | 6/2013 | Moore | H04N 25/70 |
| | | | | 348/302 |
| 2014/0010374 A1 | * | 1/2014 | Kasai | H04R 3/00 |
| | | | | 381/26 |
| 2014/0344200 A1 | * | 11/2014 | Schie | G02B 6/3863 |
| | | | | 706/20 |
| 2018/0039882 A1 | * | 2/2018 | Ikeda | H01L 27/14618 |
| 2019/0146474 A1 | * | 5/2019 | Cella | H04L 67/1097 |
| | | | | 702/188 |

* cited by examiner

EVENT DRIVEN MATHEMATICAL ENGINE AND METHOD

RELATED APPLICATIONS

This patent application is related to U.S. Provisional Application No. 62/663,121 filed Apr. 26, 2018, entitled "EVENT DRIVEN MATHEMATICAL ENGINE" in the name of David Schie, and which is incorporated herein by reference in its entirety. The present patent application claims the benefit under 35 U.S.C. § 119(e).

TECHNICAL FIELD

The present invention generally relates to an event driven mathematical device that may be used as an image sensing device, an audio sensing device or perform other event driven mathematical tasks and, more particularly to, an event driven mathematical engine that is able to analyze images, sounds or other sensor information such that the analysis engine, may only process in the event of a pixel change, image information, audio information or other sensor information.

BACKGROUND

Many types of sensors are capable of producing large quantities of data that, when taken together, may form an "image" of an object or terrain sensed. In many applications, the object or terrain is sensed repeatedly, often at high speed, thereby creating many images constituting a voluminous amount of data. In these applications, the image data needs to be processed in some way, in order to be useful for a particular application. While it is possible to perform this processing "off-line" (i.e., at a time after all of the data has been collected), the application that mandates the collection of image data may further require that the images be processed in "real-time", that is that the processing of the image data keep up with the rate at which it is collected from the sensor. In general, due to the volume of data it is difficult to process this information locally and cloud-based systems or central processing units may be utilized to bring together information from multiple sensors and analyze that information.

In many applications, the image formed from the data collected may not change significantly over time. For example, a security camera watching a warehouse overnight might expect to see almost no change whatsoever unless there is an intruder. Even when there is an intruder, the intruder information may only change a very small area of the image field. Unfortunately, a camera trying to analyze a large warehouse needs to have high resolution so that the small area showing the intruder may be properly analyzed. This generally means a huge amount of data must be sent somewhere to look for the presence of the intruder. Smart city sensors are another example. In these types of sensors, there may be changes from day to night, and peripheral changes to non-critical areas such as a plant moving in the wind in an area of the field or cars in the distance which are not relevant to the subject being watched, but otherwise very little change.

In some applications extremely high-speed cameras are used which might have thousands of frames per second and involve millions or even tens of millions of pixels. Such an imager might for example be watching a high-speed assembly line for defects, a piece of high-speed industrial equipment, or be analyzing a rotor propulsion unit on a plane or other vehicle to maintain integrity. In these examples, only defect information such as a damaged product or a crack forming on a rotor are relevant and often such defects are expected in a specific area. Other data captured by the high-speed cameras may not change and/or be relevant.

Thus, as may be seen above, the need for real-time image processing is becoming a commonplace requirement in many different types of applications. Unfortunately, it is often difficult to process vast amounts of real-time data in a timely and efficient manner.

Therefore, it would be desirable to provide a system and method that overcome the above problems. It would further be desirable to provide a system and method to analyze images such that the analysis engine, for example a neural network or similar machine learning system, only processes in the event of a pixel change. It would be further be desirable if groups of pixel changes could be prioritized while changes in other pixels ignored by weighting their importance. Finally, it would be desirable if multiple frames of pixel information could be selectively stored so that the event driven pixel analysis could compare frames over a non-linear time frame or in different order rather than in succession. In the above example, if one could save a few hundred frames at the frequency of the rotating propeller that is being watched then only those frames in and around the time the propeller is in the field of view could be considered. It would further be desirable if rather than a frame based solution, differences in pixel values could be used to cause trigger events while pixels which do not show a difference in value are not processed. If this were extended to groups of pixels or even results of a neural network partial processing it would allow event based processing on image subsets rather than just pixels.

For example the need for event driven fingerprint sensor devices, or gesture monitoring devices for handsets or wearables or audio devices such as earbuds or personal assistants which are "always on" to react to stimuli without explicitly being turned on is a critical emerging field that is poorly addressed by solutions which do not offer low power event driven operation.

SUMMARY

In accordance with one embodiment, an event driven device is disclosed. The event driven device has a network collecting data. A device may be coupled to the network for determining changes in the data collected. The device signals the network to process the data collected when the device determines changes in the data collected.

In accordance with one embodiment, an event driven device is disclosed. The event driven device has a neural network collecting data. The neural network comprises a plurality of analog multipliers. Switches allow coupling of selected analog multipliers. The switches control coupling and decoupling of desired analog multipliers in conformance with an event. Multiplication in each selected analog multiplier is triggered by an input to a desired selected analog multiplier and associated summing circuit reaching a reference threshold value. A comparator device is coupled to the neural network for determining changes in the data collected. The comparator signals the network to process the data collected when the device determines changes in the data collected.

In accordance with another embodiment, an event driven device is disclosed. A level shift is used to set a reset value of a single transistor multiplier and sum device during a first exposure conforming with a sampled value such that the potential lowering caused by the transfer gate on a subsequent exposure does not induce transfer of electrons if the pinned photodiode collects the same charge (the image has not changed). This results in an event based neural network processing only if pixel values change without the operation of a pixel value comparator.

In an extension embodiment a group of pixel values or processed neural network results may be used to trigger an event such that the recognition of a partial image may trigger an event such a pruning of specific image data or capture of an image at the time of recognition of an imaging event. Similarly, the output of a group of neurons from different layers may be summed to produce a result, and these may potentially be summed with other groups of neurons so as to develop a template which reflects a likelihood that a given image is present or a sound has been heard. By using an analog neural network, the charge information from pixels, the charge from an audio membrane or other sensor data which is typically analog may be used directly saving the power and latency associated with digitizing, packetization, transmission and polling.

BRIEF DESCRIPTION OF THE DRAWINGS

The present application is further detailed with respect to the following drawings. These figures are not intended to limit the scope of the present application but rather illustrate certain attributes thereof. The same reference numbers will be used throughout the drawings to refer to the same or like parts.

DESCRIPTION OF THE APPLICATION

The description set forth below in connection with the appended drawings is intended as a description of presently preferred embodiments of the disclosure and is not intended to represent the only forms in which the present disclosure may be constructed and/or utilized. The description sets forth the functions and the sequence of steps for constructing and operating the disclosure in connection with the illustrated embodiments. It is to be understood, however, that the same or equivalent functions and sequences may be accomplished by different embodiments that are also intended to be encompassed within the spirit and scope of this disclosure.

The present disclosure provides a system and method to analyze images, words or information from other sensors such that the analysis engine, for example a neural network or similar machine learning system, only processes in the event of a change such as a pixel or audio membrane capacitance charge change. The system and method may allow for prioritizing groups of pixel changes by weighting their importance. The system and method may ignore certain groups of pixel changes if these groups of pixel changes are deemed unimportant. The system and method may allow for multiple frames of pixel information to be selectively stored so that the event driven pixel analysis could compare frames over different time scales including non-linear comparison or in different orders rather than in succession.

A neural network or machine learning engine which could accept direct charge from the active pixels would allow asynchronous event driven clocking such as that described above. A two-dimensional (2-D) charge coupled device (CCD) serial shift register associated with a global shutter timed against a known application previously analyzed by the neural network could be used to determine when to sample. For example, in the propeller case above or in the smart city sensor case where we want to ignore the cars in the background. In high speed imaging applications, a 3500 frame per second imager might be associated with 10 million or more pixels. There could be ten imagers. At ten bits resolution this means 3.5e3*10e6*10=3.5e12 or 3.5 terabits per second of data. It is extremely difficult to digitize, packetize, and communicate this much data to a central processing unit for analysis. It is therefore critical in these cases that an event driven imager process only changed information of interest so that the data can be communicated and acted upon in a timely fashion.

Figure 1:
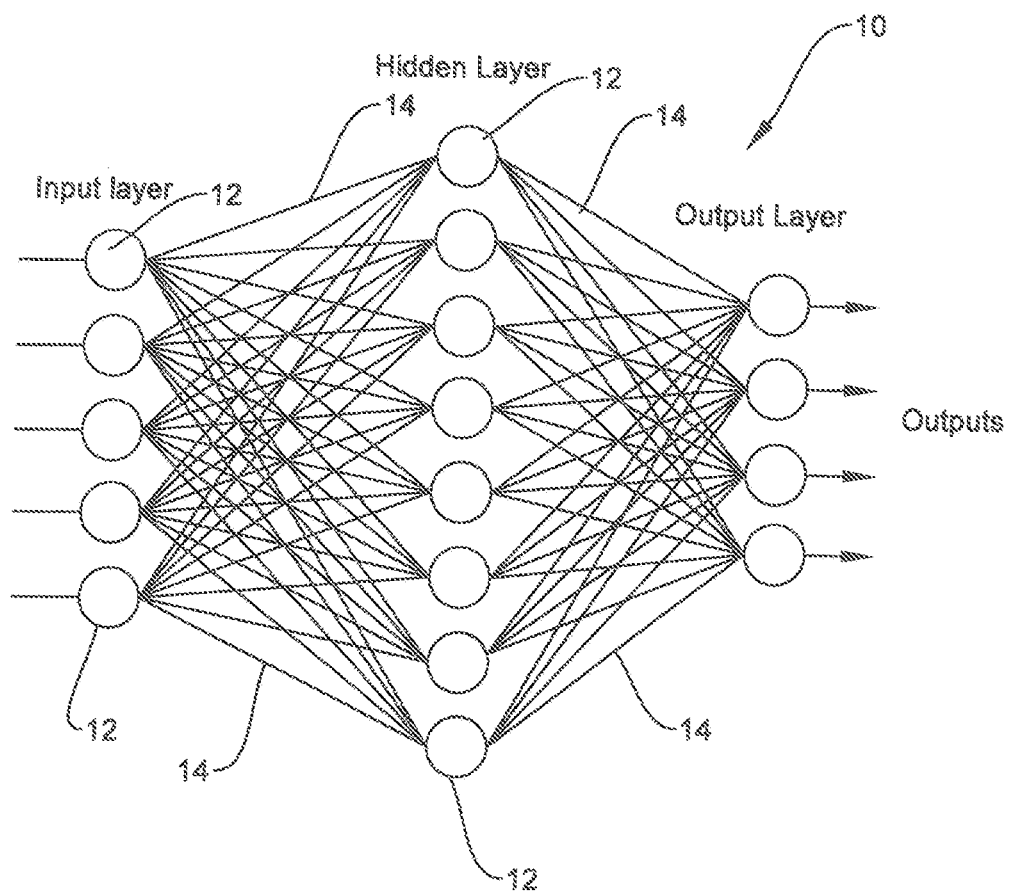
FIG. 1 is a block diagram showing an exemplary embodiment of a neural network architecture that relies upon a multiplier within each connection in accordance with one aspect of the present application.

Neurons within a neural network 10 for example may be connected with a one-to-many architecture that relies upon a multiplier within each of a huge number of connections as illustrated in FIG. 1. In the neural network 10, the circles 12 are neurons. The lines 14 are multipliers which multiply input data such as pixel output values by a weight (w) to produce input data for subsequent layers. After summing all of this input data, the result may be fed to a decision circuit or to subsequent layers and that output in turn fed to the next layer. As each neuron, containing a summer of the weighted inputs and in some cases a decision circuit, may have its output connected to many neurons through multipliers in the following layers, therefore the number of weights can be very large. Although a simplified example of a neural network is shown there any many configurations such as convolutional neural networks, recurrent networks or other configurations, and that many different configurations may be built using crossbars and similar mathematics such as convolutions, pooling, decision circuits, expansion or other required elements. The ideas contained herein and the concept of multipliers, summers, and multiplexed connections are meant to be considered as extended to all these such implementations but are not described individually as they are well known to those skilled in the art.

Figure 2:
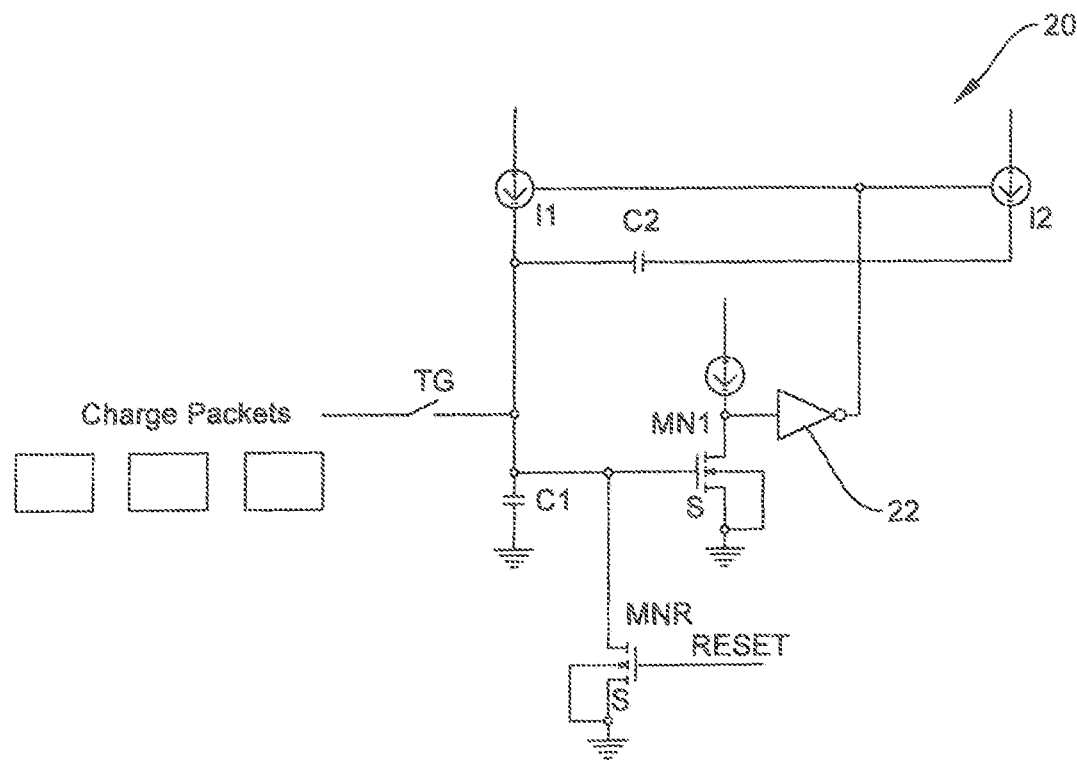
FIG. 2 is block diagram showing an exemplary embodiment of a multiplier in accordance with one aspect of the present application.
Figure 14:
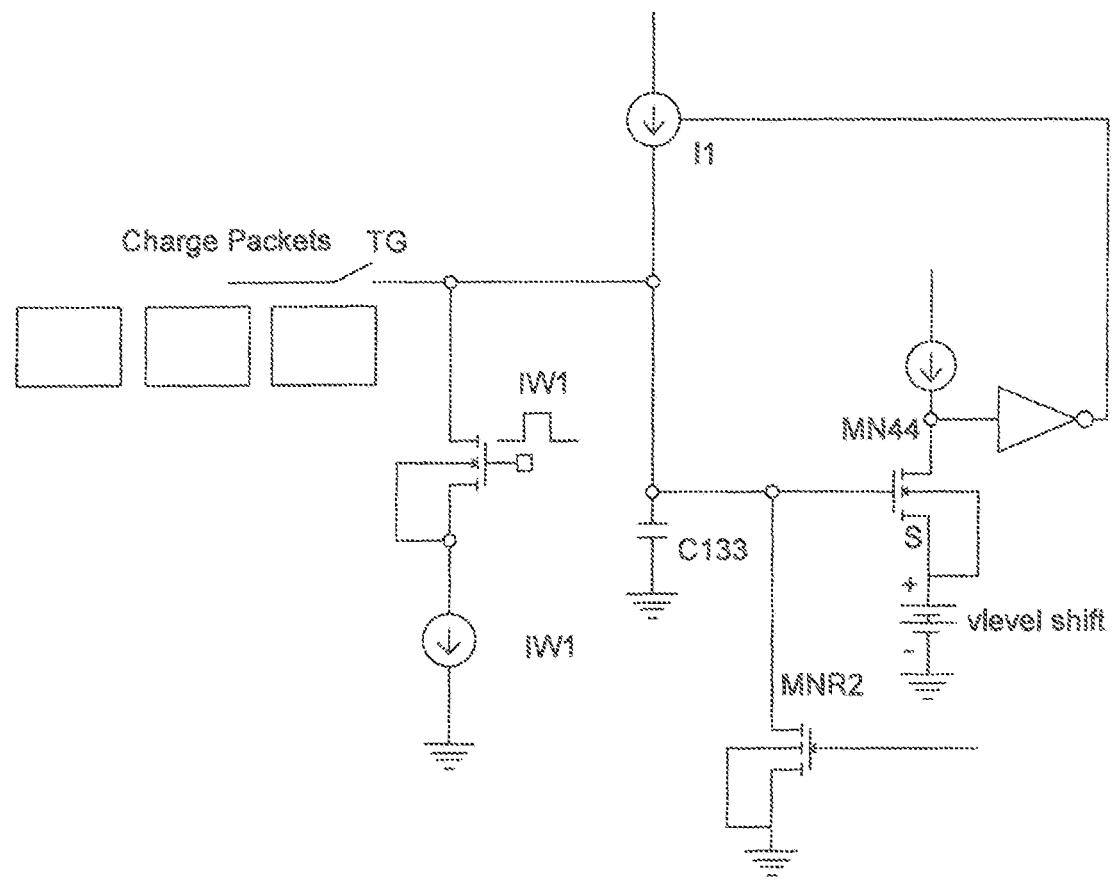
FIG. 14 shows an exemplary event based single transistor multiplier using a level shift to adjust the reset threshold in accordance with one embodiment of the present invention.
Figure 15:
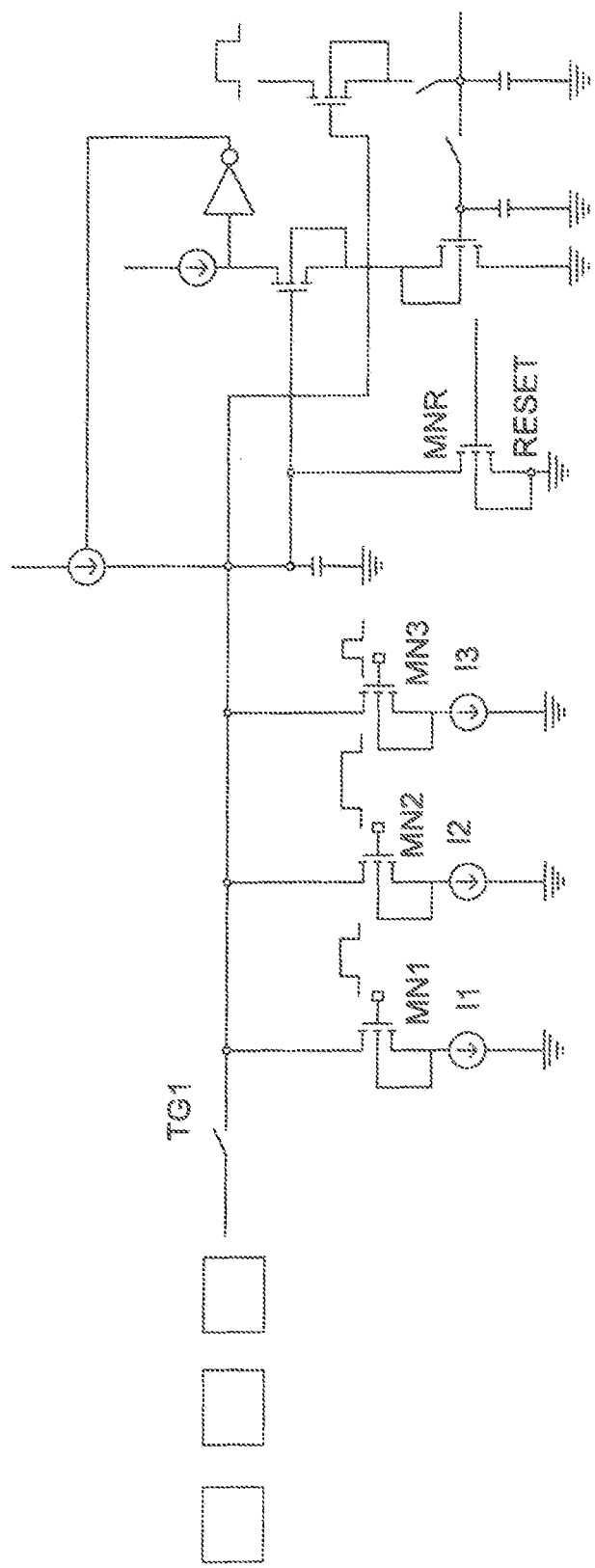
FIG. 15 shows an exemplary event based single transistor multiplier and sum circuit with multiple weighted inputs and a charge input such as that which might be coupled through a transfer gate from a pinned photodiode, as well as a sample and hold circuit and level shift in accordance with one embodiment of the present invention.
Figure 17:
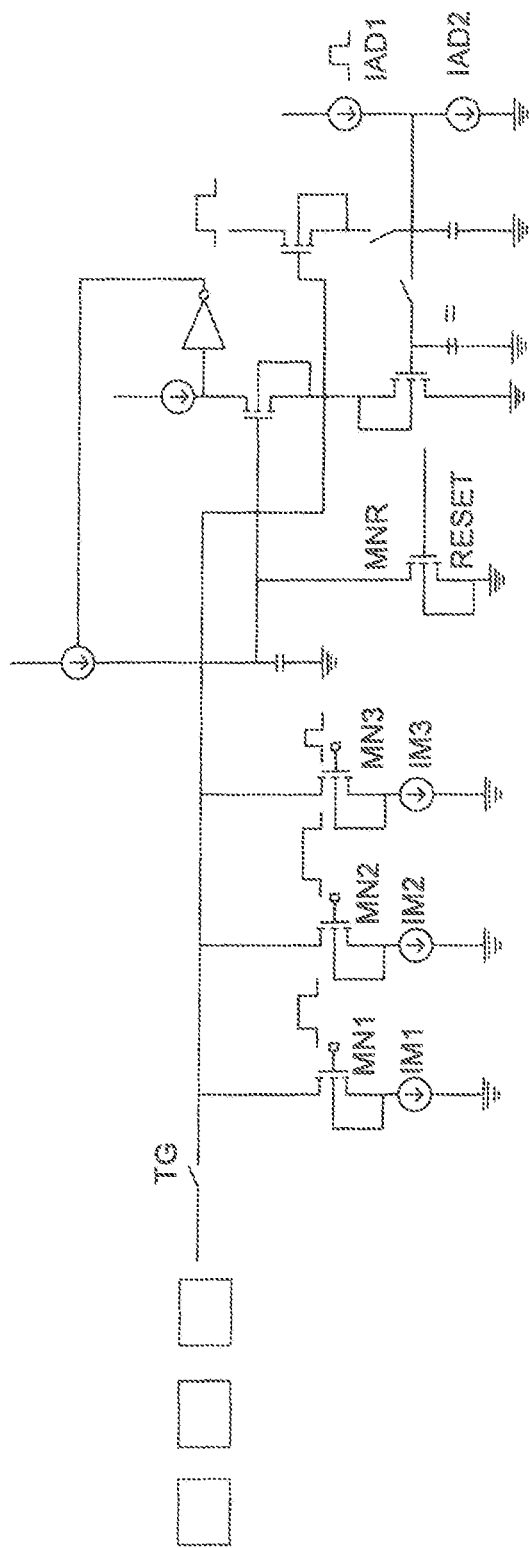
FIG. 17 shows an exemplary implementation of a single transistor multiplier and sum circuit of FIG. 15 with the addition of a pair of current sources which adjust the reset value of the single transistor multiplier and add circuit to require a minimum change required for spill and fill to occur.

Referring to FIG. 2, a charge-based multiplier 20 (hereinafter multiplier 20) may be seen. The multiplier 20 is similar to that disclosed in co-pending application entitled "Single Transistor Multiplier and Method Therefor", Ser. No. 16/291,311, filed on Mar. 4, 2019 and which is incorporated herein by reference in its entirety. FIGS. 14, 15 and 17 also draw their origin from co-pending patent application having Ser. No. 16/291,311.

In accordance with one embodiment, the multiplier 20 may have a MOSFET MN1. The MOSFET MN1 may be arranged in a common source configuration. A current source $I_{MN1}$ may be coupled to the drain of the MOSFET MN1. An inverter 22 may be coupled to the drain terminal of the MOSFET MN1. An output of the inverter 22 may be used for gating two current sources I1 and I2 whose current magnitudes may be proportional.

A capacitor C1 may have a terminal coupled to the first current source I1 and to the gate of the MOSFET MN1. A second terminal of the capacitor C1 may be grounded. The first current source I1 may be coupled to a second terminal of a capacitor C2 and to the gate of the MOSFET MN1. The second current source I2 may be coupled to the first terminal of the second capacitor C2.

A reset switch may be coupled to the gate of the MOSFET MN1. In accordance with one embodiment, the reset switch may be a reset transistor MOSFET MNR. In the present embodiment, the MOSFET MNR may be configured in a common source configuration. A gate terminal of the MOSFET MNR may be coupled to a reset signal RESET. A transfer gate TG may be coupled to the gate terminal of the MOSFET MN1, the first terminal of the capacitor C1, the second terminal of C2 and the current source I1.

This multiplier 20 can directly accept charge-based packets provided that it is built in a triple well and the potentials established such that the charge can spill into it.

Figure 3:
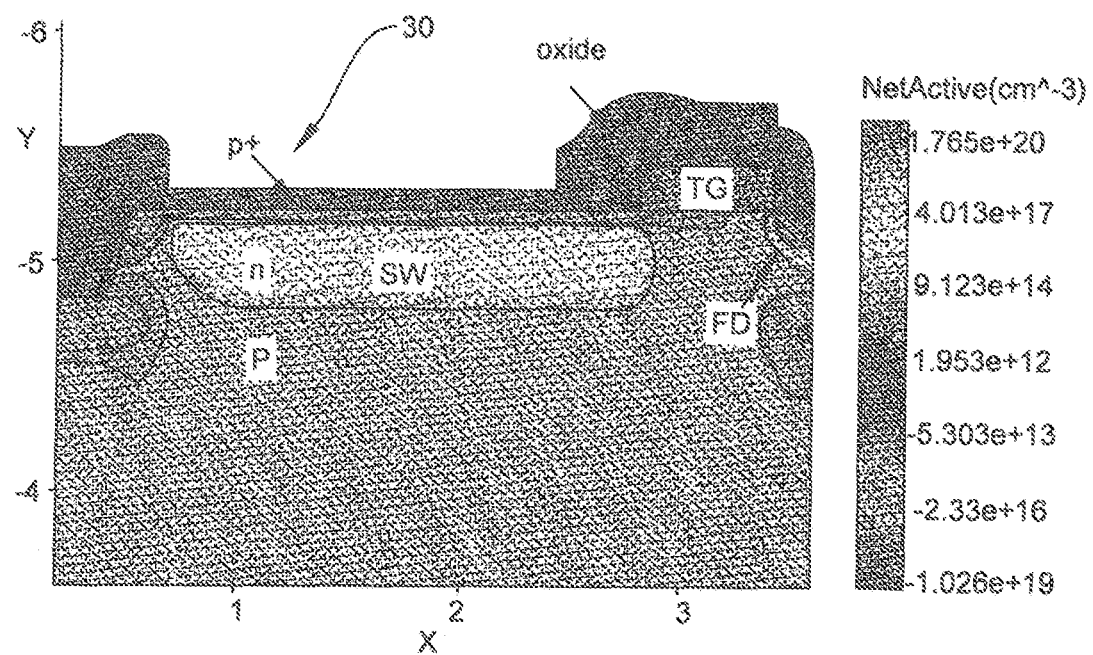
FIG. 3 shows a cross-sectional view of a buried pin diode structure showing active doping areas.

In silicon imaging it is common to rely on the integration or movement of charge using charge domain structures such as spill and fill circuits, CCD shift registers, photodetectors, correlated double sampling circuits, and similar devices. Spill and fill circuits may rely upon the concept of a buried pinned diode. FIG. 3 shows a cross-section view of a buried pin diode structure 30 showing active doping profiles. The buried pinned diode 30 may integrate electrons created when light is collected by the buried pinned diode 30 into a storage well SW region. A second charge reservoir, the floating diffusion FD, is created on the far side of a transfer gate labelled TG.

Figure 4A:
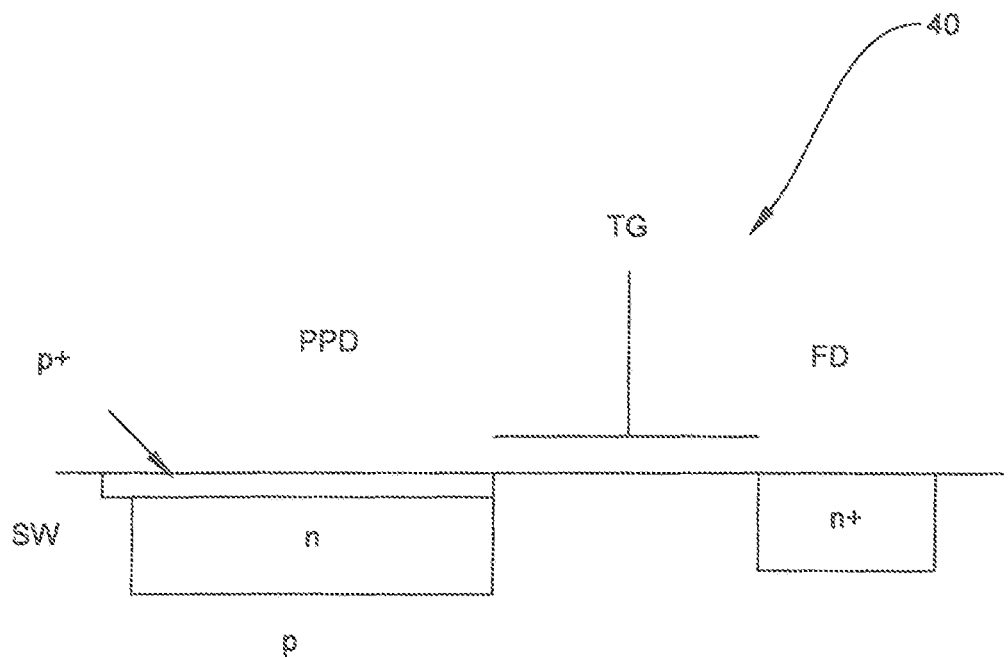
FIG. 4A shows a spill and fill circuit.
Figure 4B:
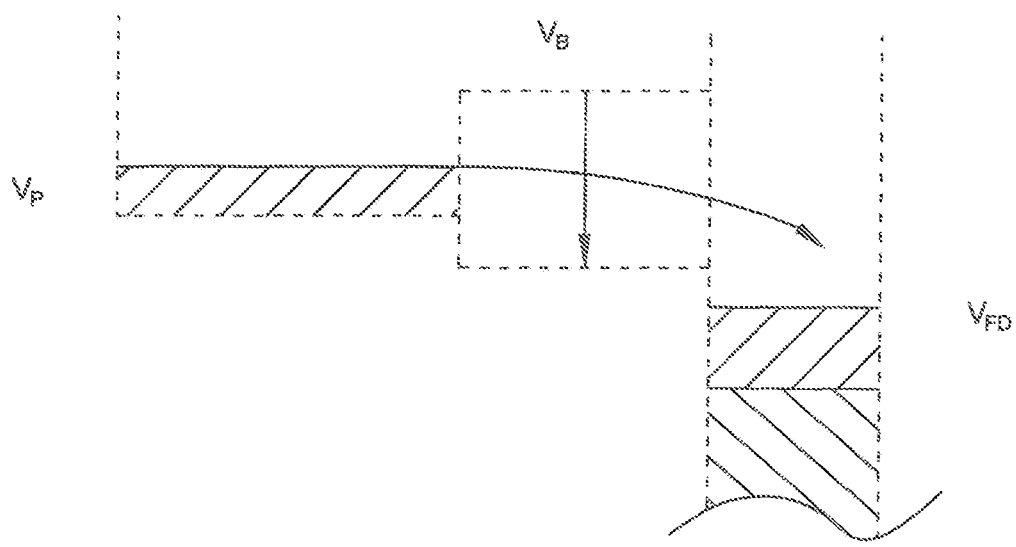
FIG. 4B shows an energy diagram from a storage well SW charge reservoir into a floating diffusion FD charge reservoir for the spill and fill circuit of FIG. 4A.

Referring to FIG. 4A, a spill and fill circuit 40 may be seen. The spill and fill circuit 40 uses the concept of a pinned photodiode (PPD) charge receptacle (SW) holding electrons in front of a transfer gate TG. The transfer gate TG is lowered and raised in conformance with required electron flow. At some point the transfer gate TG lowers the potential barrier and the electrons spill from the storage well SW charge reservoir into the floating diffusion FD charge reservoir. The devices are created so as to ensure that all electrons move from the storage well SW charge reservoir into the floating diffusion FD charge reservoir. FIG. 4B shows the energy diagram from the storage well SW charge reservoir into the floating diffusion FD charge reservoir.

Figure 5:
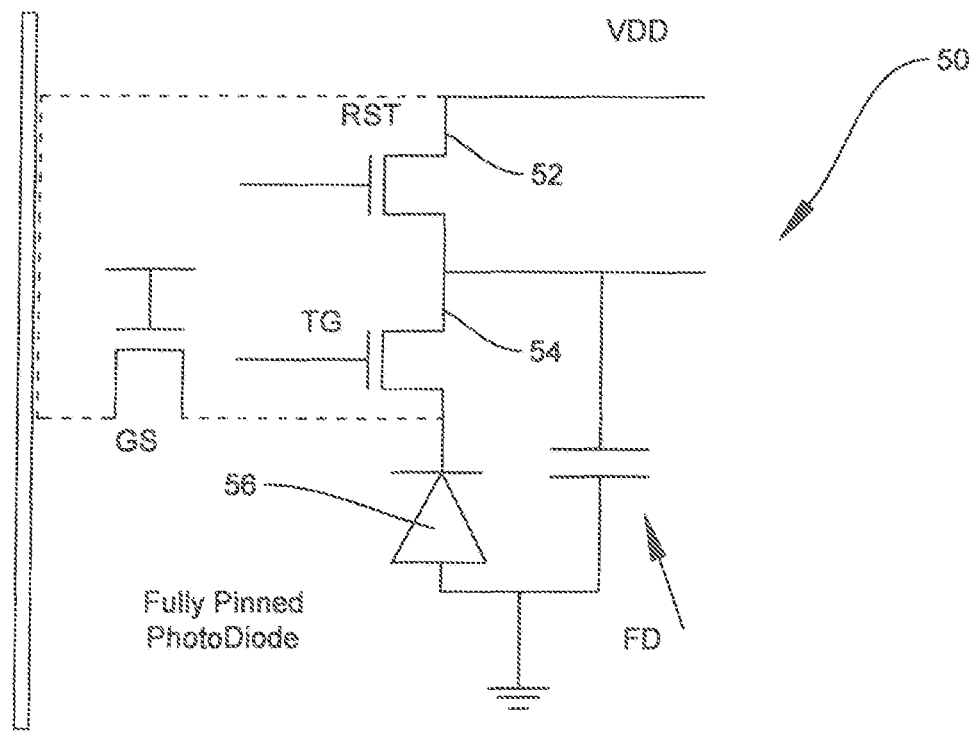
FIG. 5 shows an exemplary global shutter pixel circuit in accordance with one aspect of the present application.

FIG. 5 shows a typical global shutter pixel circuit 50 (hereinafter circuit 50) common in the industry. The circuit 50 may have stored a pixel charge on a floating diffusion FD. The circuit 50 may have a first transistor 52, a second transistor 54 and a pinned photodiode (PPD) 56. The circuit 50 may incorporate and use the elements previously shown and described with respect to FIGS. 3 and 4.

In the proposed configuration of the circuit 50, the input pixels may be the first layer of the neural network. The GS input shown in FIG. 5 which holds the PPD reset may be used to control the event of beginning integrating the photons for a given pixel and the TG may be utilized to control the event of transferring the integrated electrons to the multiplier shown in FIGS. 2, 14, 15 and 17.

Figure 6:
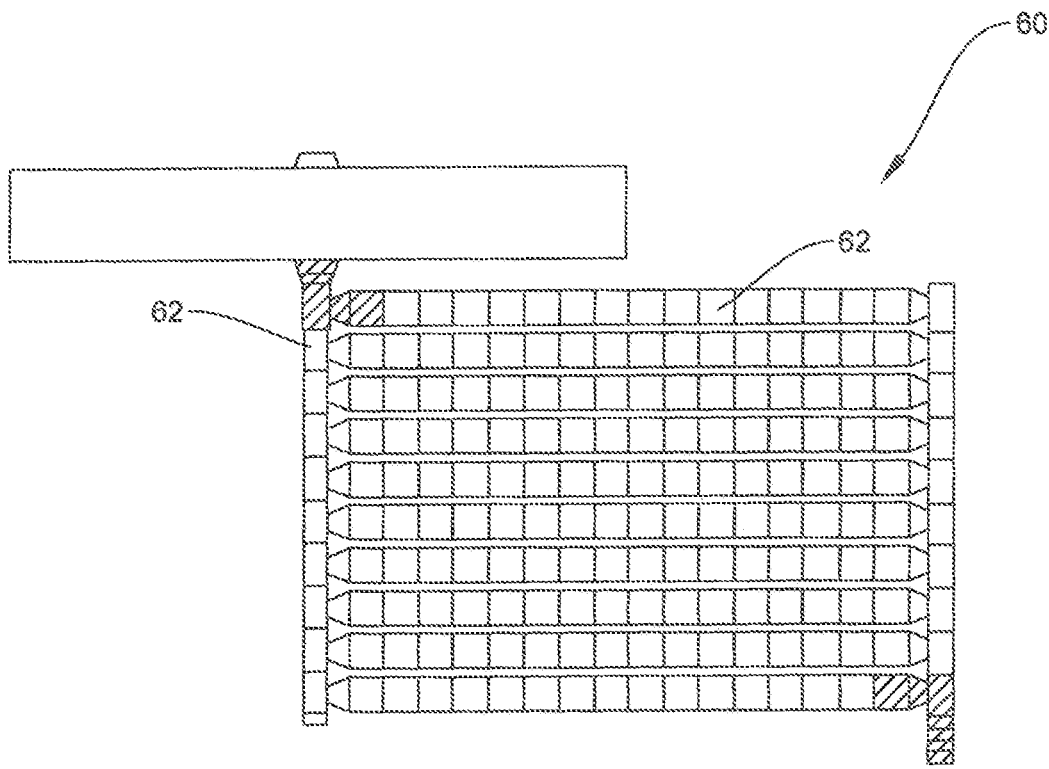
FIG. 6 is block diagram showing an exemplary embodiment of a two-dimensional charge coupled shift register in accordance with one aspect of the present application.
Figures 7A, 7B, 7C, 7D:
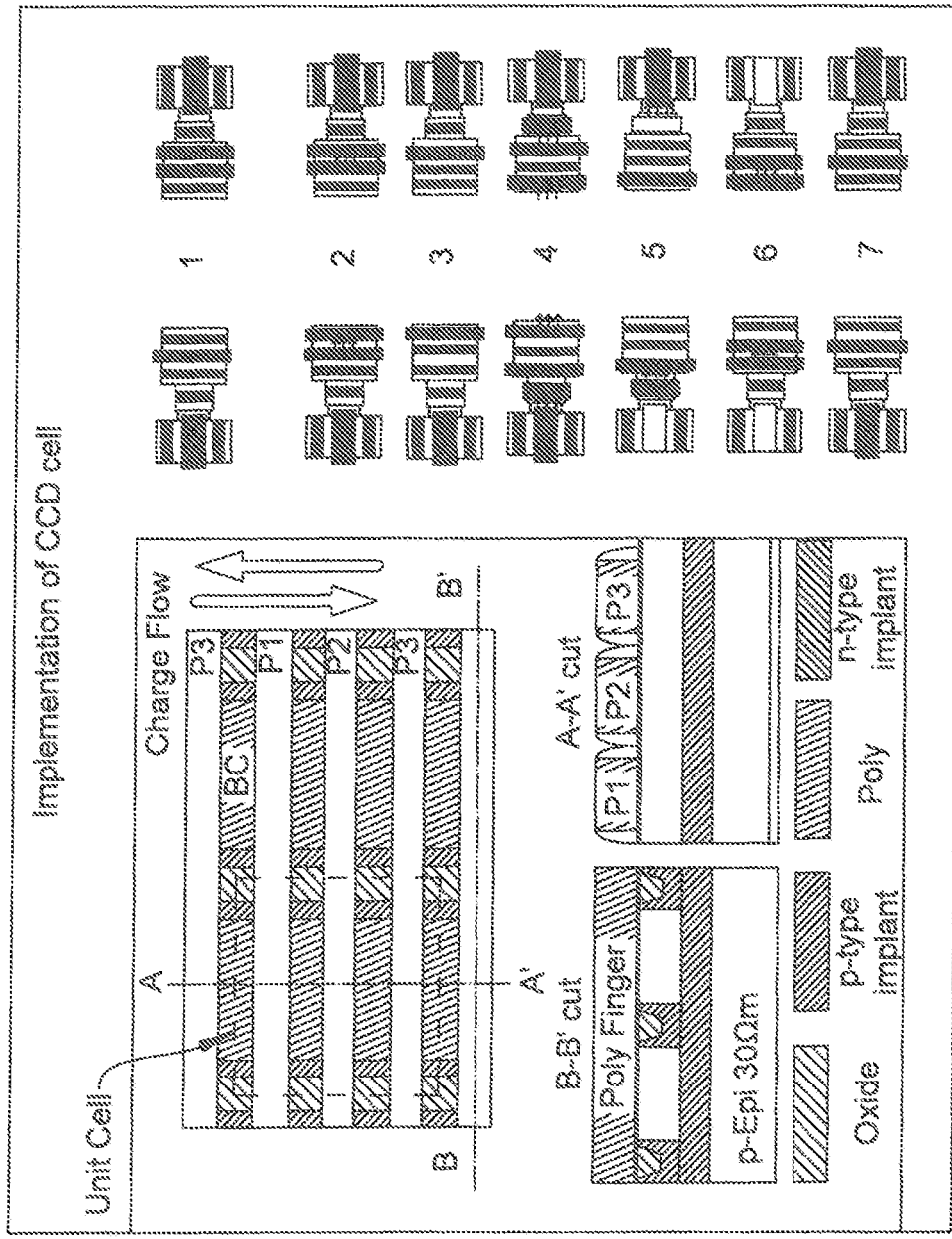
FIG. 7A shows a top-level view of a CCD shift register in accordance with one aspect of the present application.
FIG. 7B shows a cross sectional view of said CCD shift register along the poly finger in accordance with one aspect of the present application.
FIG. 7C shows a cross section view of said CCD shift register cutting across the poly fingers in accordance with one aspect of the present application.
FIG. 7D shows different configurations of CCD shift registers where data may be moving vertically and then horizontally to alter the flow of information in different directions.

Referring to FIG. 6, a two-dimensional charge coupled serial shift register 60 (hereinafter shift register 60) may be seen. The shift register 60 may be formed of a plurality of cells 62. The shift register 60 may move the charge without loss of fidelity of the charge information. It is also possible to move the charge along multiple axis and to combine charges held within specific reservoirs. Multiple shift registers 60 can also be used to move multiplicand information in different directions and at different speeds.

FIG. 7A-7D depict multiple cross-sectional views of a charge coupled device (CCD) shift register 60. The CCD shift register 60 allows for X and Y movement of stored content.

In this case charge information is coupled from the input at high speed vertically and then transferred horizontally for memory storage and finally may be coupled vertically or the final stage may be removed in parallel to multiple multiply circuits such as those shown in FIG. 2. The time constant of this CCDSSR or CCDSR (charge coupled device shift register or serial shift register) allows nanoseconds to tens, hundreds or even thousands of milliseconds of storage without loss of information. This would allow storage of frames at a desired sequence rate such as at the arrival of each propeller stroke especially if the CCDSSR were built into the pixel.

It is possible to move the charge vertically or horizontally in the CCDSSR and to utilize two CCDSSR or two CCDSSR cells to sum charge. It is also possible to utilize combinations of the multiplier in FIG. 2, 14, 15 or 17 to store, manipulate, compare charge and in general to find or create a combinations of conditions which cause an event.

For example, in the above case of analyzing a rotor/propeller, one could choose a group of pixels somewhere in the image that corresponded to the edge of the propeller stroke where said pixels are coupled to a CCDSSR or CCDSR, which is in turn coupled to a parallel group of multipliers such as those shown in FIG. 2, 14, 15, or 17. A weighted sum of these pixels could be combined and stored upon an accumulator capacitor. Each cycle just this group of pixel values could be combined and compared against a threshold. In this way we have created an event that is determined by a weighted sum of pixels set by the neural network. The multiply and accumulate circuit can then process larger groups of pixels knowing that the propeller is in the frame for analysis.

In the warehouse example, one could utilize the CCDSSR by storing multiple copies of the images, loading the multiply and accumulate circuit as a subtraction between pixel exposures by using complementary devices, multiplying the result and dumping it if it does not reach a threshold. In this way only pixels which change by the threshold would be re-acquired and otherwise the neural network would maintain the previously loaded pixel values.

Figure 8:
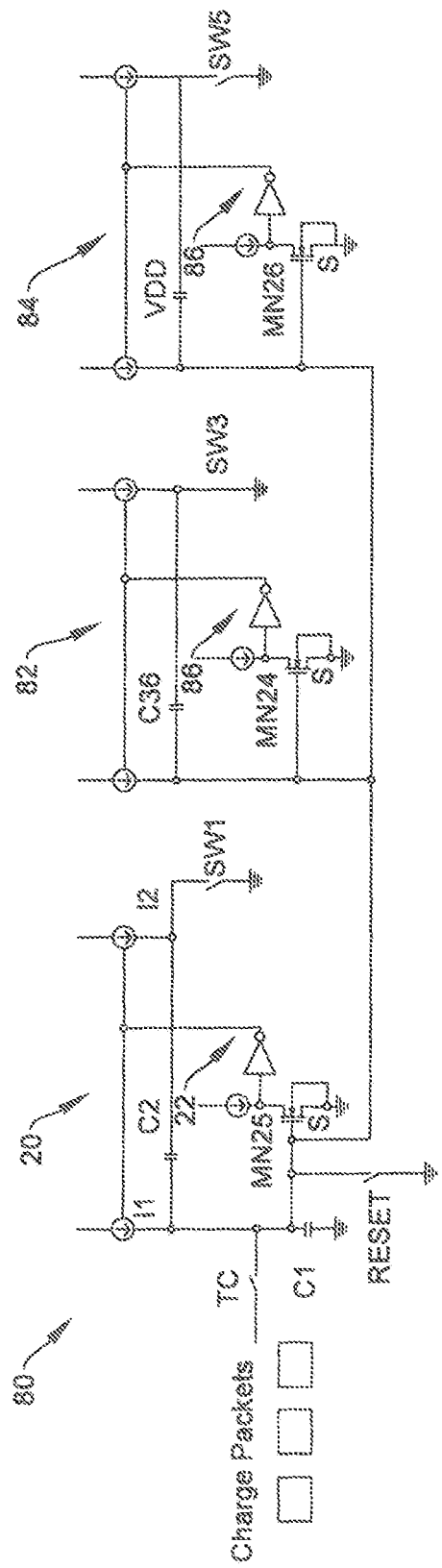
FIG. 8 shows an exemplary embodiment of a warp and accumulate multiplier in accordance with one aspect of the present application.

Referring to FIG. 8, shows a warp and accumulate multiplier 80. This multiplier can be used to load multiple inputs over several cycles and then to multiply them simultaneously by multiple operands to see if they match a template, or to multiply a single input by multiple operands for example to create minimum and maximum window thresholds for a subsequent comparison. The warp and accumulate multiplier 80 may use the multiplier 20 shown in FIG. 2. The multiplier 20 may have a switch SW1. The switch SW1 may have a first terminal coupled to the second current source I2 and a second terminal grounded. The multiplier 20 may also have a reset switch RESET (MOSFET MNR), coupled to the first terminal of the first capacitor C1, I1 and the transfer gate TG.

Additional multipliers 82 and 84 may be coupled to the multiplier 20. In accordance with the present embodiment, each multiplier 82 and 84 may be coupled to the multiplier 20 at a connection called node which is coupled to the drain terminal of the MOSFET MNR, the first terminal of the first capacitor C1, the second terminal of C2, C36, and C37 and to I1, I3 and I5 and the transfer gate TG.

Each multiplier 82 and 84 may have a common source comparator MOSFET similar to MN1 from FIG. 2. In the case of 82 it is MN24 and in the case of 84 it is MN26. Current sources are coupled to the drain of each of MN25, MN24 and MN26. Inverters 22, 85 and 86 may be coupled to the drain terminals of each common source comparator MOSFET MN25, MN24, MN26. An output of the inverter 85 may be used for gating two current sources I3 and I4 whose current magnitudes may be proportional, and an output of the inverter 86 may be coupled to two current sources I5 and I6 whose current magnitudes may be proportional. Each multiplier works similarly to that in 20 except that the ratios might be different between I1/I2, I3/I4, and I5/I6 such that each might hold a different multiplied version of the same input pixel charge value provided the inverters 22, 85 and 86 are gated independently for each respective sample or results previously multiplied and stored on one or more of C2, C36 could be combined and multiplied onto C37 (or other combination). For example, we close SW1, SW3 and SW5 and then load the threshold of MN26 into C2, C36, and C37 by gating only I5 (not I6) with inverter 86. Next we open SW1, SW3 and SW5. Now we strobe reset and then enable only inverter 22 to control only I1 (not I2) until MN25 switches and turns off I1. Next we load the input charge data through TG and then allow MN25 to multiply with I1 and I2 to reduce the charge in C2 from its MN26 reset level by the multiplied input charge. We can repeat the same activity with 82 with a different pixel charge input. Next we can reset node to the MN26 reset level using I5 and inverter 86 controlling I5 only (and not I6) and finally we can turn on SW1 and SW3 to combine the multiplied charges on node and finally enable MN26 to multiply a result onto C37 with 86 gating I5/I6. This final voltage or charge across C37 can then be compared to a window comparator threshold to enable processing if it fits within the window indicating the pixel values met a template.

Figure 9:
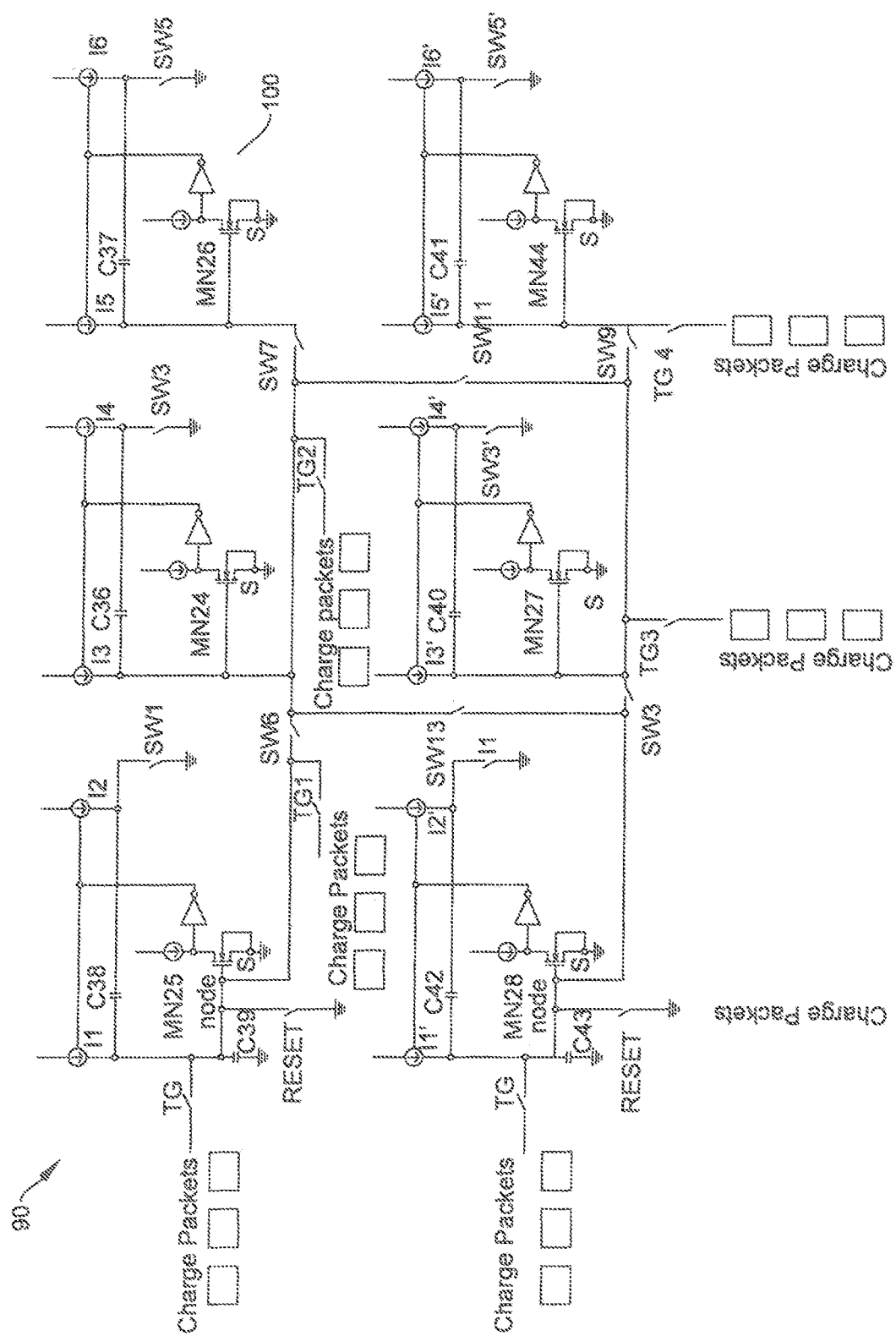
FIG. 9 shows an exemplary embodiment of a parallel/series systolic multiply and accumulate circuit in accordance with one aspect of the present application.

Referring to FIG. 9, a parallel/series systolic multiply and accumulate 90 may be seen. The parallel/series systolic multiply and accumulate 90 extends the warp and accumulate multiplier 80 from FIG. 8 by adding a plurality of transfer gates TGx to allow parallel loads from multiple pixels or a CCDSSR. This implementation is particularly interesting for an event driven system since we can multiply and sum multiple charge inputs to see if they meet a window comparator threshold as a condition of further processing. For example, lets reset node to the threshold of the MN26 common source MOSFET comparator with SW6, SW7, SW8, SW9, SW10, SW11, SW1, SW1', SW3, SW3', SW5, SW5' on. Next we open SW1, SW3, SW5, SW1', SW3', SW5', SW6, SW7, SW8, SW9, SW10 and SW11. Now we allow each multiply and sum circuit except MN26 (the output summer) to load its individual reset level and then couple its input charge through TG, TG1, TG2, TG3, TG4 and multiply the result with the desired multiplicand at each multiplier using its current source ratio. Now the multiplied charges are stored on each of the floating capacitors C38, C36, C42, C40 and C41. Next we can close SW6, SW7, SW8, SW9, SW10, SW11 and recapture the switching threshold of MN26 on node. Now we can close SW1, SW3, SW1', SW3', SW5' but not SW5 and combine all of the multiplied charge differences relative to the MN26 reset level on node. Now we can multiply this accumulated charge with the I5/I6 ratio. We then open SW7, close SW5 and compare the ground referenced negative voltage on C37 to a window comparator threshold or simply measure differentially across C37 with said window comparator. This is an example of a multi-pixel trigger template—if the combined value of the pixel charges do not meet a window threshold then we do not process. We could also have added comparators to the individual floating capacitors C38, C36, C42, C40, C41 previous to combining charges and ANDed or OR'ed some combination of these comparison results (stored digitally) with the sum result on C37 to initiate further processing and even used that template result to gate a second template result with a different set of window comparator thresholds and/or multiplier ratios to create a more complex multiframe (video) template.

Figure 10:
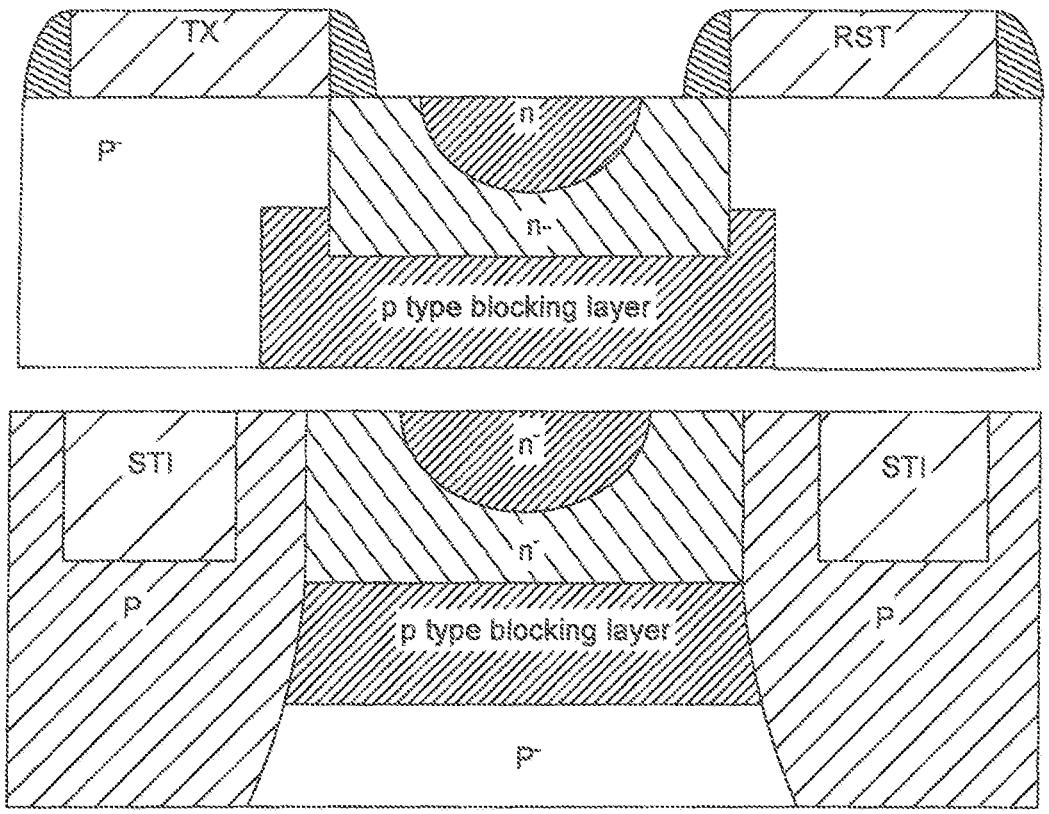
FIG. 10 shows an exemplary transfer gate with minimized junction overlap capacitance in accordance with one aspect of the present application.

FIG. 10 shows a depleted junction transfer gate which enables smaller capacitors, for example in the fF range, for the multiplier cell in FIG. 2 by reducing the overlap capacitance of the transfer gate which would otherwise require larger storage capacitors to reduce the potential change error related to charge injection.

Figure 11:
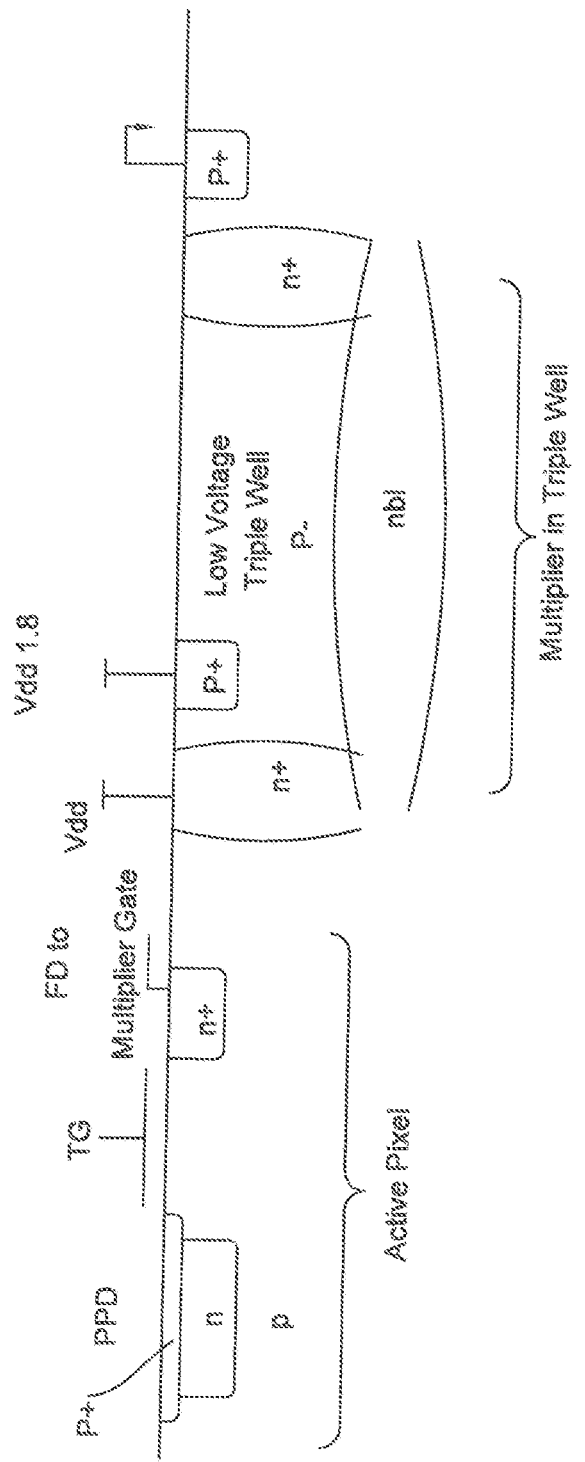
FIG. 11 shows an exemplary embodiment of a pixel coupled to a triple well in accordance with one aspect of the present application.

Referring to FIG. 11, a pixel coupled to a triple well may be seen. Those skilled in the art may realize that the active pixel shown is very simple. One could replace this simple pixel with an active pixel with CDS (correlated double sampling) including multiple floating diffusions and perhaps a CCD shift register between the floating diffusions of the pixel and the gate of the input MN common source comparator. FIG. 11 further illustrates that although the triple well operates from some low voltage, like 1.8V across it, referred to the triple well voltage of VDD at which the pixel operates (such as 5V), that additional VDD level circuitry such as a comparator could still measure voltages below the isolated psub ground and nodes within the triple well, such as the gate of the MN comparator, could go negative with respect to the isolated p well local ground. Note that the gate of the MN comparator is connected to the FD diffusion in this diagram although not explicitly shown.

Figure 12:
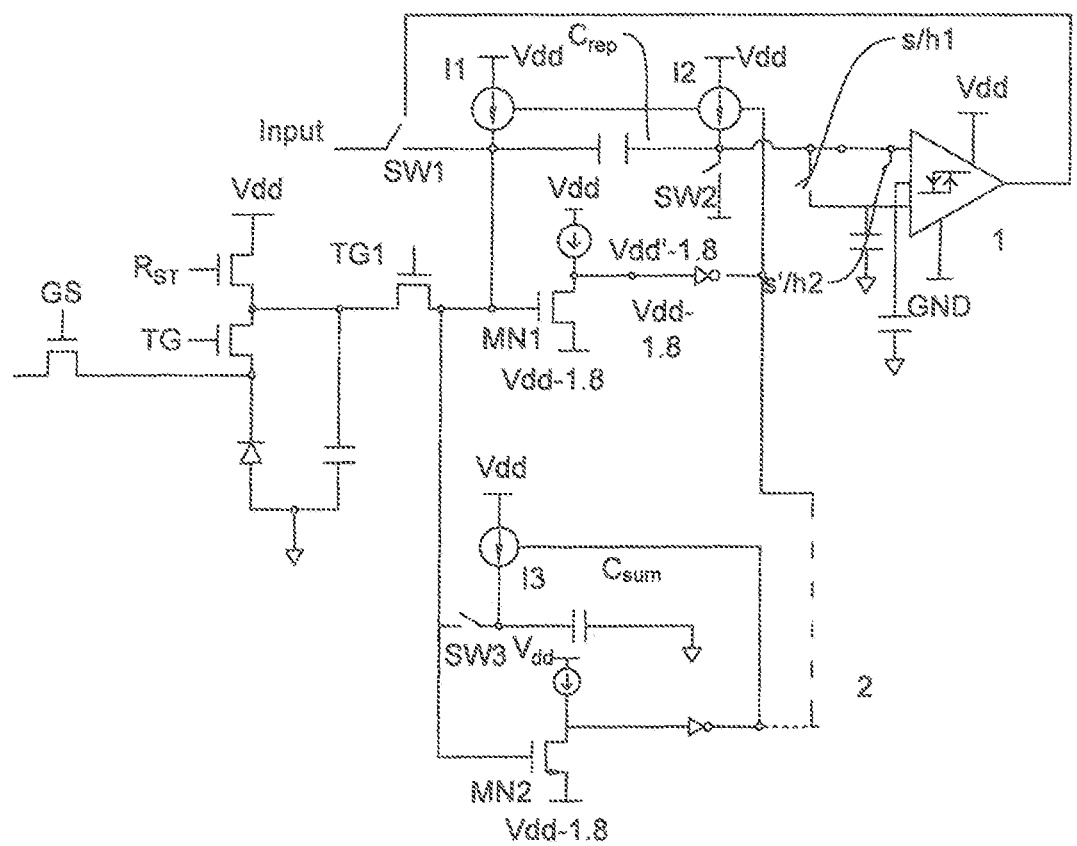
FIG. 12 shows an exemplary embodiment of a two threshold event driven pixel coupled circuit in accordance with one aspect of the present application.

FIG. 12 extends this idea to two potential event driven schemes. Here the active pixel is represented in its schematic form and further coupled by a transfer gate to the MN common source comparator located within a triple well. In this case we can assume that Csum and Crep are loaded in a previous cycle to the MN2 reset voltage. We now load a first pixel reading onto Csum with whatsoever multiplicand we chose to program through the ratio I2/(I1+I2) to adjust the threshold.

In a first case we can make two quick pixel readings and store two multiply adjusted thresholds, one lower and one higher to create a window on the window comparator (marked with hysteresis symbol in FIG. 12). On the next pixel reading if we are outside that window we can connect switch SW1 and load the pixel value into the next stage knowing that the pixel value has changed. The dual threshold readings are much faster than the frame rate and may be stored for multiple cycles. After a delay corresponding to the frame rate we read the next pixel value and if it is outside the window it is quickly read into the next stage without a frame delay and included in the NN calculation.

In the second case 2 we can load a pixel value into Csum in a first cycle, assuming we have loaded the MN2 trip point voltage into Csum already as well as Crep with SW3 closed and then opened after loading. We can then multiply the pixel value by a desired threshold adjustment to make the threshold higher or lower. We can now reset the gate of MN2 to its set point using I1 and load a next pixel value after a frame delay. Now we can load Crep using I3 with SW3 open to reach a set point above the MN2 trip point where I3 may be used to scale or adjust the trip point (adjust value). Closing SW2 we can now close SW3 combining its charge with that on Csum. As both are normalized to the switch point of MN2 we will trip MN2 now only if we exceed a threshold calculated from the I2/(I1+I2) ratio and I3 adjust value. To check a lower and a higher value for the pixel we can do two comparisons at high speed compared the frame rate, with different ratios and/or adjust values, and then turn on SW1 to provide the pixel value on a third cycle faster than the frame rate.

Figure 13:
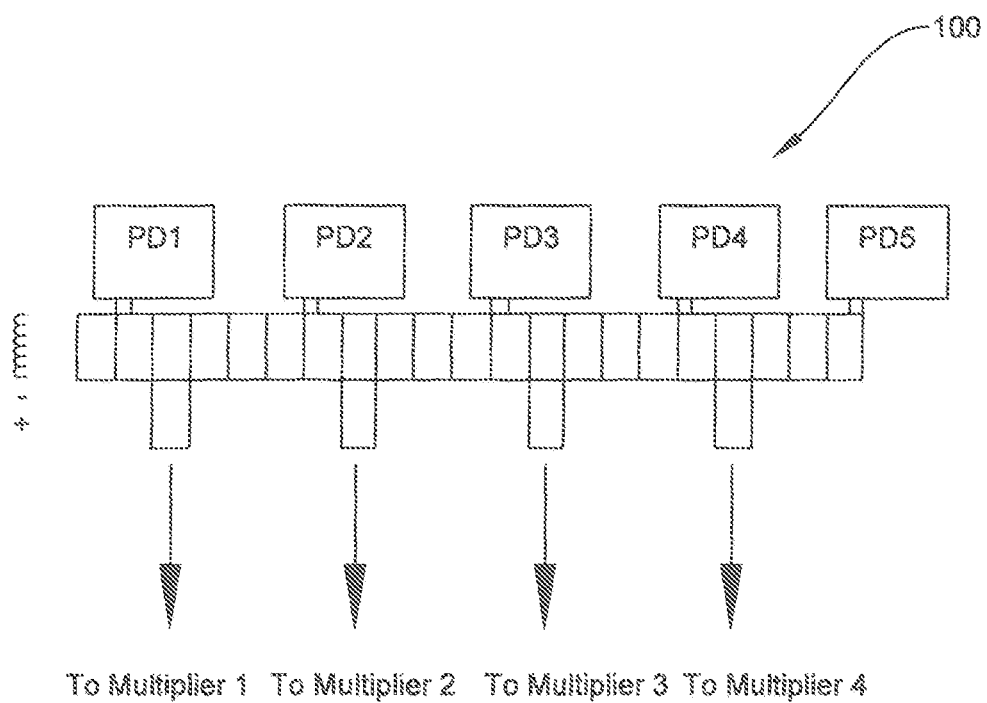
FIG. 13 shows an exemplary charge coupled serial shift register interfacing to multiple pixels in accordance with one embodiment of the present invention.

FIG. 13 shows a charge coupled serial shift register 100 interfacing to multiple pixels which can move information in series and parallel directions.

FIG. 14 shows a second embodiment of a single transistor multiply and add circuit. In this case charge is coupled by weighted input pulses from previous layers or through a transfer gate for spill and fill functionality from a pinned photodiode. Assuming first the value of vlevelshift=0V, a RESET signal is initially used to discharge the gate node of MN44 through MNR2. Thereafter I1 is enabled by a control signal (not shown) until it is disabled by the common source comparator MN44 through the inverter, thereby finding its own trip point. Thereafter, the voltage on the gate of MN44 is reduced either by coupling electrons from a pinned photodiode or other floating diffusion or CCDSR through the transmission gate TG; and/or by a pulse gating the current source IW1 where the magnitude of the current source IW1 is programmed proportionally to I1 to implement a desired weight and the input pulse width multiplied by said weighted current source value removes a charge at the gate of MN44 representing said weighted sum. In the next cycle I1 is enabled simultaneous to the initiation of an output pulse which is terminated once the potential on the gate of MN44 turns off I1. The resulting output pulse represents the weighted sum of the inputs, including the charge from the pixel, which may be used as inputs to subsequent multiply & add circuits of a similar type or may be applied to decision circuits or other machine learning related circuits.

Now consider the adjustment of Vlevelshift to adjust the value of the reset voltage and assume for the moment that the magnitude of IW1 is zero. During a first exposure we perform a multiplication as described previously, except at the end of said exposure and before said multiplication one can store a potential on the level shift such that during the subsequent exposure (not present exposure) the RESET potential equals the potential of the floating diffusion on the left side of the transmission gate TG. Now on a subsequent exposure and operation similar to that described earlier, there will be no movement of electrons when the transfer gate is lowered and thus no processing of a multiply operation. This produces a very low power imager (or other sensor) sample and hold since an image which does not change uses only the power used to lower the TG barrier and no power for a comparator or other circuitry as in competitive implementations. This method in fact requires no comparator since we are relying on the multiply & add circuit simply not initiating comparator operation due to the level shift.

On the other hand, if the potential has changed, then the spill and fill circuit will initiate a pulse which is proportional to the change in the pixel value, allowing processing only of those pixels which changed and only the change magnitude processed.

Figure 16A:
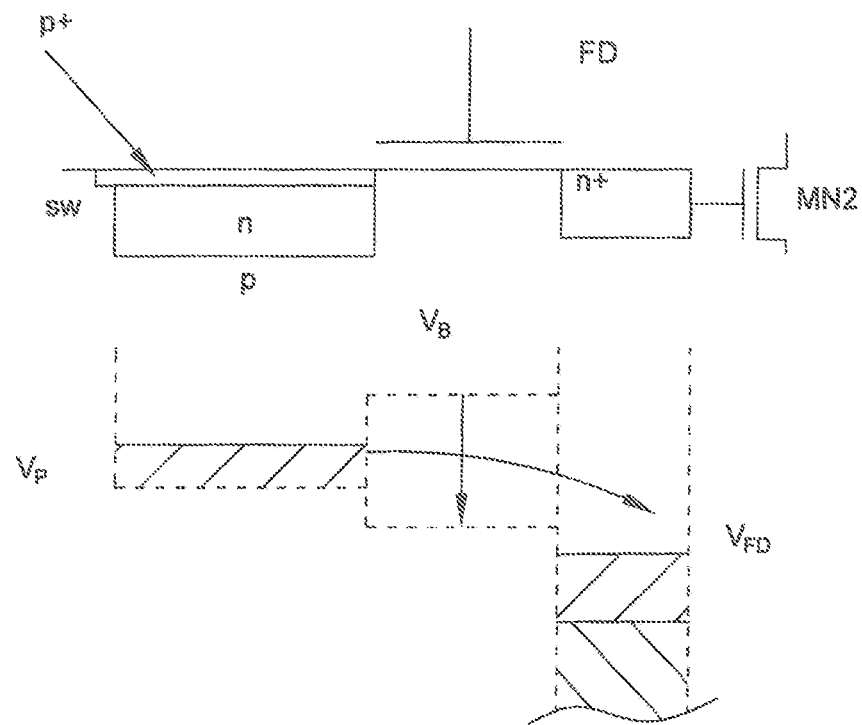
FIG. 16A shows the band diagrams associated with a spill and fill circuit where the charge from exposure on the pinned photodiode exceeds that on the floating diffusion coupled to the gate of the single transistor multiplier gate node in accordance with one embodiment of the present invention.
Figure 16B:
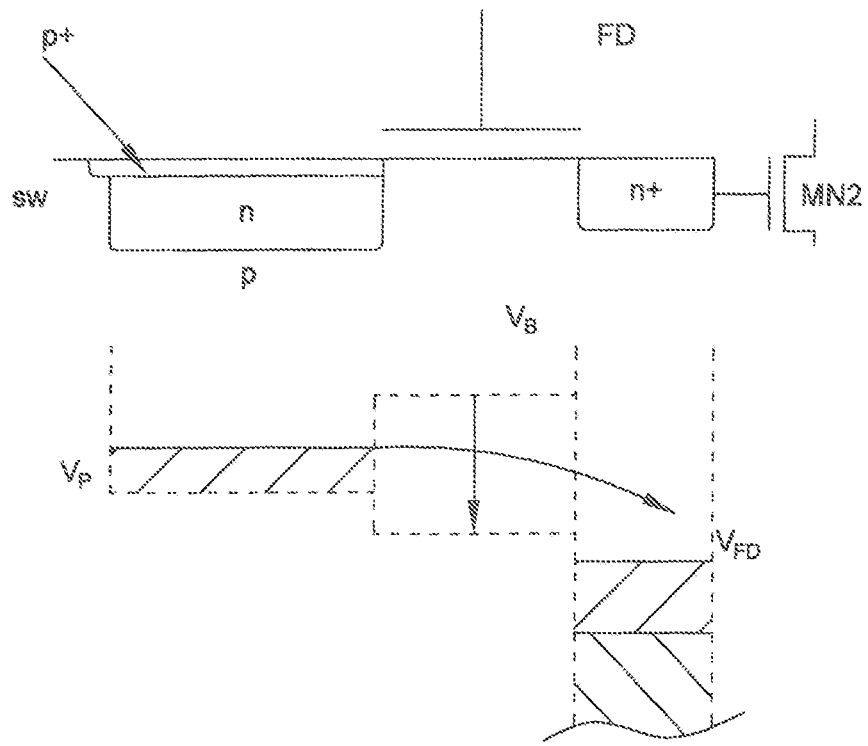
FIG. 16B shows that the band diagram when the potentials of the gate node of the single transistor multiplier is reset to the same exposure potential value such that electrons do not move to said single transistor multiplier gate in accordance with one embodiment of the present invention.

FIGS. 16A and 16B show the band diagram of the circuits above. FIG. 16A shows a spill and fill circuit where there is a potential difference between it and the gate of the single transistor multiplier device (MN2 in FIGS. 16A and 16B or MN44 in FIG. 14). FIG. 16B shows the same band diagram on the second exposure, assuming no change in pixel value, after the level shift is used to make the potential on the gate of MN2 the same as that of the pinned photodiode. As is illustrated when the transmission gate barrier TG is lowered no electrons will spill from the pinned photodiode to the floating diffusion since the potentials have been equalized. As a result, almost no power is used unless the image changes allowing extended operating time from a battery in low traffic areas. Critically, this method does not require the use of a comparator or other circuitry to compare past and present pixel values for each exposure.

FIG. 15 shows extensions to the single transistor multiplier and sum circuit with the addition of more weighted inputs and an explicit example of the level shift. For example, at the end of the first exposure and processing, TG3 stores the voltage at the gate node less Vtn on C2. After multiplying and outputting a pulse, this voltage is transferred onto C3 through TG2 (C2 is larger than C3) and then TG2 is opened. The gate node is then RESET producing substantially the same voltage on the gate node as that stored on the pinned photodiode such that it does not cause a processing event during the subsequent exposure if the pixel value has not changed. This example only responds in one direction to less charge removed from the gate node than a previous exposure, however, it is meant to be illustrating such that those skilled in the art could create a similar circuit to implement the function in both directions (increased or decreased pixel value). This could be done for example using a complementary structure (eg. p-channel devices). Other methods to store the previous pixel value and couple that reset voltage to the gate node in anticipation of the next exposure may also be used.

If the pixel value has changed, for example is less bright or less charge has been collected by the pinned photodiode, then the PPD voltage has increased then the spill and fill circuit will operate and electrons will spill into the gate node inducing a processing event of the difference between the previous pixel potential and the new pixel potential.

In FIG. 17 current sources IAD1 and IAD2 are added which may be used to adjust a threshold. By utilizing two such circuits with a parallel (multiple copies of an exposure) stored for example in a CCD shift register, performing two comparisons with different adjust levels in rapid succession, or other means we can compare the exposure to either a higher or a lower threshold with a window comparator or OR the output to indicate a change outside of this range. At the expense of some current these current sources may also be used to reset the level shift voltage to a desired level before the first exposure to enable a bi-directional reset range (increased or decreased pixel charge).

Finally, one can use a combination of the outputs of such circuits summed together either at the input layers or using a combination of layers within the neural network to produce an event based on a partial image recognition, sound or other sensor input. This would allow us for example to sample an image and process when we see a known portion of a high speed machine and recognize such a characteristic at a rate higher than any other solution would allow or to minimize power in an always on system.

The above teachings could be very powerful for example in failure analysis or robotics where only a very small portion of the image changes at very high speed and the rest of the image changes slowly or is static. In this case the described system can update only the pixels which change, and effectively prune only that data of interest by communicating only the change in pixel values.

In intersection applications we could focus on only license plates or faces. In a warehouse overnight where no changes are observed we could extend battery life by effectively eliminating any power except the extremely small power required to strobe the transfer gates which is much less power than any other solution presently available.

As an example of a non-imaging application, the method above could be applied to charge input from a capacitive membrane MEMs microphone in an audio application. A MEMs microphone operates through a variable capacitor comprising a membrane conforming to sound information. The membrane alters the physical distance between capacitive plates and therefore alters the charge it contains based on sound information. This charge may be coupled to a multiply and sum circuit in the same way that the pixel is. The always on requirement of the described level shift adjustment of the spill and fill circuit will allow extended the battery life compared to solutions which rely on active comparators, except a template may be implemented which requires a time based sum of charge values from the microphone or combination of outputs from within the neural network. Meeting the requirements of this template can gate further processing. This template may either be implemented by comparing charge values in frames over time against multiple thresholds, and/or summing charge values over time against a single threshold, or establishing reset values which suppress spill and fill operation over multiple frames such that no operation of multipliers indicates the meeting of said threshold. This can be important in applications like earbuds which are presently expanding their capability to add voice command recognition. Digital systems which poll often require repeated words and constantly draw more power compared to the method described above due to digitization, reduced processing efficiency and additional processing requirements. This multi frame template approach can also be used for video activity recognition such as gesture control or motion sensor activity recognition.

While embodiments of the disclosure have been described in terms of various specific embodiments, those skilled in the art will recognize that the embodiments of the disclosure may be practiced with modifications within the spirit and scope of the claims

What is claimed is:

1. An event driven device comprising a neural network whose input layer comprises pixel charge data coupled through transfer gates to a plurality of analog multiply and sum devices, the multiply and add devices comprising level shifts which are used to adjust a reset level of the analog multiply and sum devices;
   wherein after the processing of each exposure by the analog multiply and sum devices, the reset level of the analog multiply and sum devices are set to the potential of the exposure such that in a subsequent exposure a spill and fill circuit will transfer no charge to the multiply and sum devices unless a pixel value has changed.

2. The event driven device of claim 1 wherein an output pulse reflects only a difference in pixel value between exposures as a result of a new input value.

3. The event driven device of claim 2 comprising an adjustment device to set the reset level to program a desired minimum change in pixel value before performing multiply and add functions.

4. The event driven device of claim 1 where the reset level is set by storing an initial floating diffusion (FD) potential using a sample and hold circuit which is coupled to a level shift coupled in series with a source of a common source transistor of a single transistor multiplier.

5. The event driven device of claim 4 wherein a pair of gated current sources adjust the reset level in conformance with a desired threshold.

6. The event driven device of claim 5 where an upper threshold and a lower threshold are programmed in two separate multiply and sum circuits.

7. The event driven device of claim 6 programmed in conformance with a response template so that if a desired response occurs the resulting pulse triggers an event.

* * * * *